(12) United States Patent
Mahapatra et al.

(10) Patent No.: US 8,263,862 B2
(45) Date of Patent: Sep. 11, 2012

(54) HERMETIC ELECTRICAL PORTS IN LIQUID CRYSTAL POLYMER PACKAGES

(75) Inventors: Amaresh Mahapatra, Acton, MA (US); Stephen M. O'Riorden, Stow, MA (US)

(73) Assignee: Linden Photonics, Inc., Westford, MA (US)

( * ) Notice: Subject to any disclaimer, the term of this patent is extended or adjusted under 35 U.S.C. 154(b) by 364 days.

(21) Appl. No.: 12/639,425

(22) Filed: Dec. 16, 2009

(65) Prior Publication Data

US 2010/0200262 A1 Aug. 12, 2010

Related U.S. Application Data

(60) Provisional application No. 61/150,744, filed on Feb. 7, 2009.

(51) Int. Cl.
*H05K 5/06* (2006.01)
*H05K 1/02* (2006.01)
*H05K 1/11* (2006.01)
*G02B 6/36* (2006.01)
(52) U.S. Cl. .................... 174/50.5; 174/50.61; 174/259; 174/263; 385/94
(58) Field of Classification Search .................... 174/50, 174/50.5, 50.51, 50.61, 259, 263; 385/94
See application file for complete search history.

(56) References Cited

U.S. PATENT DOCUMENTS

| | | | |
|---|---|---|---|
| 4,691,986 A | 9/1987 | Aberson et al. | |
| 4,778,244 A | 10/1988 | Ryan | |
| 4,848,869 A | 7/1989 | Urruti | |
| 4,906,066 A | 3/1990 | Ryan | |
| 4,925,024 A * | 5/1990 | Ellenberger et al. ......... | 174/50.5 |
| 5,529,741 A | 6/1996 | Rubin et al. | |
| 6,320,257 B1 | 11/2001 | Jayaraj et al. | |
| 6,701,047 B1 | 3/2004 | Rutterman et al. | |
| 6,957,002 B2 | 10/2005 | Cottevieille et al. | |
| 7,010,201 B2 | 3/2006 | Risch | |
| 2002/0028293 A1 | 3/2002 | Yang et al. | |
| 2002/0146563 A1 | 10/2002 | Risch | |
| 2004/0066478 A1 | 4/2004 | Farquhar et al. | |
| 2004/0105636 A1 | 6/2004 | Cottevieille et al. | |
| 2004/0240804 A1 * | 12/2004 | Mahapatra et al. ............. | 385/94 |
| 2005/0129370 A1 * | 6/2005 | Stricot et al. .................... | 385/89 |
| 2005/0286842 A1 | 12/2005 | Risch | |
| 2006/0029338 A1 * | 2/2006 | Rodriguez-Parada et al. . | 385/94 |
| 2007/0107932 A1 * | 5/2007 | Jauniskis et al. .............. | 174/260 |
| 2008/0217050 A1 | 9/2008 | Egitto et al. | |

OTHER PUBLICATIONS

Yang, Rui, "Liquid Crystal Polymers", Advanced Packaging, Mar. 2002.
Lusignea, Richard W., "Liquid Crystal Polymers: New Barriers Materials for Packaging", Advanced Packaging, Oct. 1997.
Zhang, et al., "Development of SOP Module Technology Based on LCP Substrate for High Frequency Electronics Applications", Electronics Systemintegration Technology Conference, Dresden, Germany, 2006.

* cited by examiner

*Primary Examiner* — Timothy Thompson
*Assistant Examiner* — Sherman Ng
(74) *Attorney, Agent, or Firm* — Francis J. Caufield

(57) ABSTRACT

A packaging system having a housing for providing a hermetically sealed interior space for receiving and supporting optoelectronic components. The housing has at least one section of wall comprising a layer of liquid crystal polymer (LCP). At least one hermetically sealed electrical port is formed in the LCP wall section over a predetermined area and comprises a layer of metal adhered to and overlying the predetermined area on the of the LCP wall section. An electrode passes through the metal from the exterior of the system to the interior space to provide an electrical communication path between the optoelectronic components and the exterior of said packaging system. A solder joint is formed between the electrode and the layer of metal to provide a hermetic connection between the layer of metal and the electrode to assure that the hermeticity of the housing remains unchanged with the electrical port present.

9 Claims, 8 Drawing Sheets

HERMETIC ELECTRICAL PORTS IN LIQUID CRYSTAL POLYMER PACKAGES

CROSS REFERENCE TO RELATED APPLICATION

This application claims the benefit of priority from U.S. Provisional Patent Application No. 61/150,744 filed on Feb. 7, 2009 in the name of Amaresh Mahapatra, et al. with the title HERMETIC ELECTRICAL PORTS IN LIQUID CRYSTAL PACKAGES, the entire contents of which are incorporated herein by reference.

FIELD OF THE INVENTION

This invention relates to a method of fabricating hermetic electrical ports in molded LCP packages for electronic components and circuits.

BACKGROUND OF THE INVENTION

Because liquid crystal polymers (LCPs) have excellent moisture barrier properties, electronic components that are completely encased in a molded LCP package are hermetically insulated from exposure to atmospheric moisture. However, if the package has electrical leads that enter or exit the package for purposes of connecting with exterior components, these electronic ports become points for moisture entry and hermeticity is compromised.

Air cavity packages are widely used and are a chip containment system consisting of a structural base, a die attach pad, lead frame and lid. After die and wire bonding to the base, the lid is affixed to provide environmental and mechanical protection for the die and wire bonds without touching either of these components. Applications that require hermetic packages have historically used ceramic or metal for the base and lid. Thermoplastics had not had the moisture barrier properties to achieve hermeticity.

Recently, a new class of thermoplastics called Liquid Crystal Polymers (LCP), have been introduced with excellent moisture barrier properties. Over the last several years, there has been a push to develop technology to use molded LCP in hermetic packages primarily because molded thermoplastics are substantially cheaper than ceramic or metal hermetic packages.

Hermetic electrical ports in LCP packages have long presented a technical challenge. Although molded LCP has excellent moisture barrier properties, design of an electrical port such that metal leads can enter and exit without compromising hermeticity is challenging primarily because adhesion between LCP and metal is not good. LCPs are chemically inert, which is desirable in many applications, but is an impediment in achieving good adhesion to other materials. Attempts have been made to over-mold LCP on metal pins, for example to a lead frame comprising a pair of spaced apart parallel busses with intervening components connected via leads much like the rungs of a ladder. RJR Polymers' LCP molding operation uses a patented method to seal leads from the lead frame as they pass through the sidewalls of the LCP package. However, it involves placing a small amount of epoxy on the frame during molding to. form a strong metal-to-LCP bond. The epoxy bead becomes a path for moisture ingress over time and temperature.

LCP resins are commercially available from several major suppliers—Ticona, Allied Chemicals, Dupont and Sumitomo. LCPs have the following advantages:

(a) Extremely low moisture absorption and transmission. No hydrolysis problem even at elevated temperatures.
(b) Excellent chemical stability—no effect of immersion for prolonged periods in organic solvents, sulfuric acid, chromic acid, aviation fuels.
(c) No thermal degradation up to 450° C. (Jin, 1999).
(d) Tensile strength comparable to Kevlar.

LCPs exhibit the lowest moisture transmission and absorption rates of all polymers. The permeability of LCPs to oxygen is also extremely low. As a consequence, these materials are used extensively in the food packaging industry, where thin layers of LCP are co-extruded with more conventional polymers such as polyethylene to provide an effective barrier to oxygen. LCPs are now being used to package delicate electronic, electro-optic and MEMs devices, since they present a cost effective alternative to more conventional hermetic packaging based on metal, glass and ceramic.

Accordingly, it is a primary object of the present invention to provide methods of fabricating hermetic electrical ports in molded LCP packages for electronic components and circuits.

It is yet another object of the present invention to provide LCP packages for electronic components and circuits having hermetic electrical ports for electrically connecting with exterior components.

Other objects of the invention will, in part, be obvious, and will, in part, appear hereinafter when the following detailed description is read in connection with the accompanying drawings.

SUMMARY OF THE INVENTION

This invention relates to the use of metal clad LCP sheets to form hermetically sealed packaging systems for optoelectronic components. In one aspect of the invention, a packaging system has a housing for providing a hermetically sealed interior space for receiving and supporting optoelectronic components. The housing has at least one section of wall comprising a layer of liquid crystal polymer (LCP). At least one hermetically sealed electrical port is formed in the LCP wall section over a predetermined area and comprises a layer of metal adhered to and overlying the predetermined area on the of the LCP wall section. An electrode passes through the metal from the exterior of the system to the interior space to provide an electrical communication path between the optoelectronic components and the exterior of said packaging system. A solder joint is formed between the electrode and the layer of metal to provide a hermetic connection between the layer of metal and the electrode to assure that the hermeticity of the housing remains unchanged with the electrical port present.

The housing comprises a base and a lid each of which have complementary configured mating sections for forming a hermetic seal between said base and lid wherein the lid preferably comprises a layer of LCP having the general cross sectional shape of shallow-crowned flattop hat having a brim.

In one aspect, the complementary configured mating sections are both made of LCP, and in another, the complementary configured mating sections are both made of copper to facilitate soldering them to form a hermetic joint.

In another aspect of the invention, the base is selected from the group comprising metals and ceramics for purposes of heat removal, and in another a heat sink is operatively associated with said base for thermal management.

The packaging system is structured to impede moisture ingress such that the diffusion rate of moisture from the outside to the inside of said packaging system is about 13 gm.mil/m².day.barr or lower at 90° C.

In another aspect of the invention, an electrode assembly is provided for forming a hermetic port in an LCP package where the assembly comprises an LCP washer having a layer of metal adhered to said LOP layer, an electrode passing through both the LCP washer and the layer of metal adhered thereto; and a solder joint between the layer of metal and the electrode to form a hermetic seal between the two so that the LCP washer can be adhered to the surface of an LCP package with the electrode passing therethrough to form an electric port.

Methods for fabricating the hermetic packaging system of the invention are also provided.

BRIEF DESCRIPTION OF THE DRAWINGS

The structure, operation, and methodology of the invention, together with other objects and advantages thereof, may best be understood by reading the detailed description in connection with the drawings in which each part has an assigned label and/or numeral that identifies it wherever it appears throughout the various drawings and wherein.

DETAILED DESCRIPTION

This invention relates to structures and methods by which hermetically sealed electrical ports are formed in metal coated liquid crystal polymer packages for electrical components and circuits so that they are protected from moisture but can otherwise electrically communicate with exterior devices.

Figure 1:
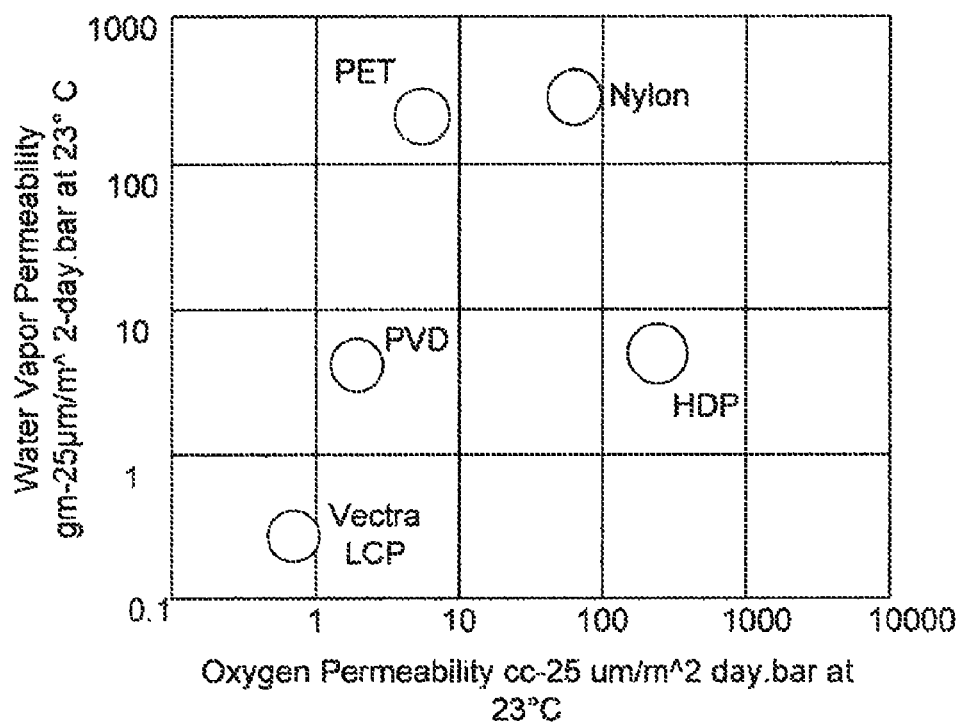
FIG. 1 is a graph showing the water vapor and oxygen permeability of LCPs and various other polymer materials.

The water vapor permeability of LCP and other polymer materials is shown in FIG. 1. The total water absorption at saturation for LCPs is about 0.02%, almost two orders of magnitude less than polyimide. The low water absorption is critical in packaging applications since absorbed moisture can cause corrosion over time.

Figure 2:
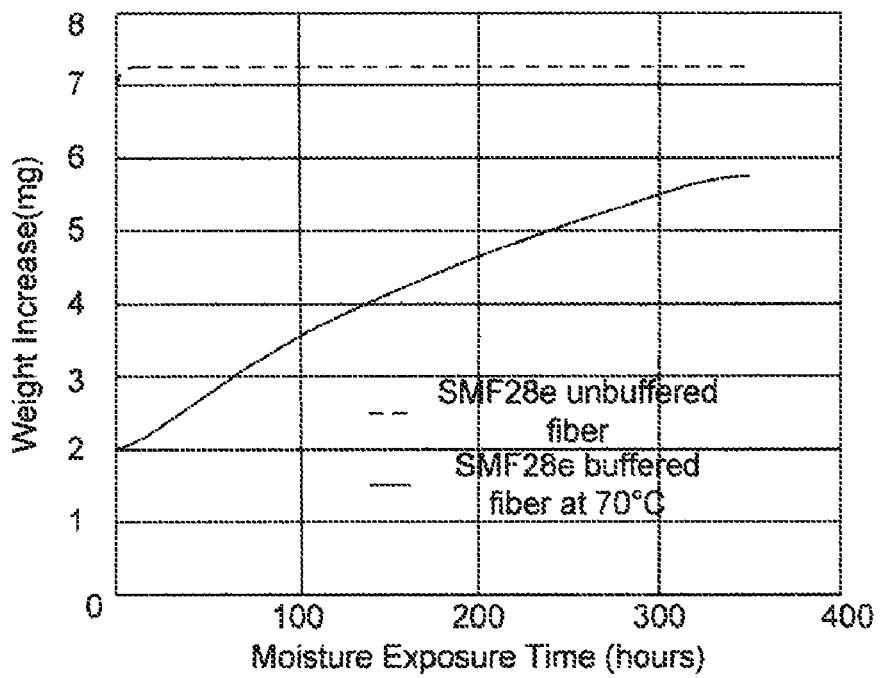
FIG. 2 is a graph showing moisture absorption with time for LCP buffered SMF28 optical fiber.

To illustrate this point, we have performed accelerated temperature moisture absorption measurements of LCP buffered SMF 28 optical cable. The acrylate buffer on commercial SMF28 rapidly absorbs 3% moisture by weight, within 20 minutes even at room temperature. An LCP buffer, applied on top of the acrylate, impedes the absorption of moisture significantly. As shown in FIG. 2, the dashed line shows moisture absorption of acrylate buffered fiber at room temperature while the solid line shows the moisture absorption in the same fiber with secondary LCP buffer at 70° C. The acrylate buffered fiber reaches saturation within minutes, even at room temperature, while the LCP buffered fiber at 70° C. has not saturated even after 350 hours. This illustrates how impervious LCP is to moisture.

Having demonstrated that LCP is impervious to moisture, the design of a novel hermetic electrical port in a molded LCP package will now be discussed. Companies such as 3M and Rogers have developed technology to produce single-sided and double-sided copper plated LCP sheets for use in flexible circuits. More information on the copper clad LCP product from Rogers Corporation, sold under the trade name ULTRALAM, can be found at their Website, www.rogerscorporation.com. The copper must adhere to the LCP sufficiently well to survive processes such as chemical etching, electroplating, soldering and thermal cycling (US patent applications: US2004/0066478 and US2008/0217050; Zhang et al, 2006). A proprietary process has been developed by these companies in which copper foil is laminated to LCP sheets at high temperature, high pressure, possibly under a nitrogen atmosphere to achieve good adhesion. Details of the process are not known, but the adhesion of the copper to LCP is excellent as evidenced by the properties listed in data sheets available from Rogers Corporation.

Rogers Corporation has developed a proprietary manufacturing process to match the coefficient of thermal expansion (CTE) of LCP to that of copper. This provides good dimensional stability over temperature and time.

We have developed a way to use these commercially available copper clad LCP sheets to implement hermetic electrical ports in molded LCP packages. The excellent adhesion of the copper to the LCP means that moisture will not be able to penetrate through the copper-LCP interface.

Figure 3:
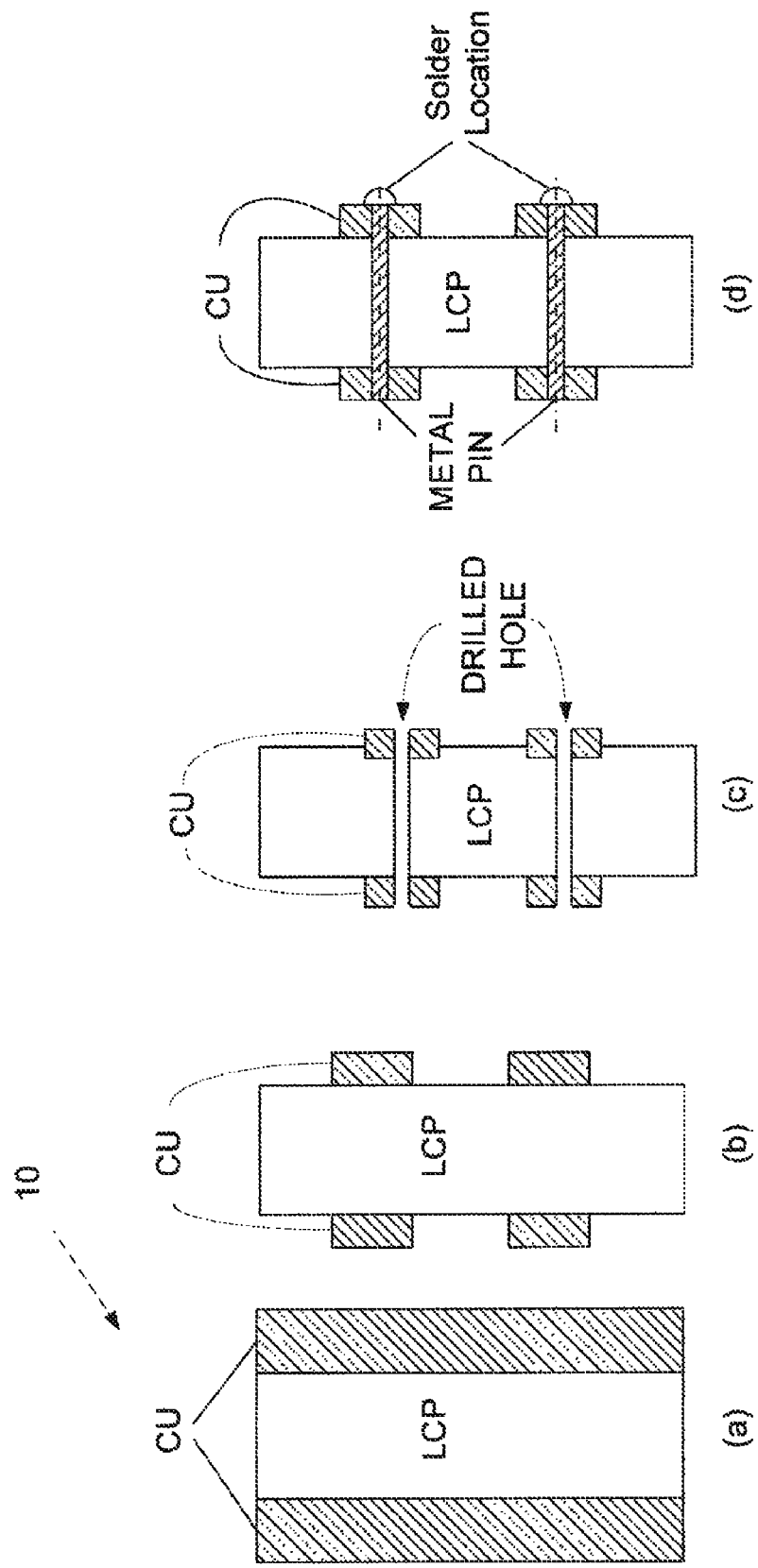
FIG. 3 is a diagrammatic representation showing various steps for fabricating hermetic electrical ports in LCP packages.

One method of implementing a hermetic electrical port in an LCP package is shown in FIG. 3. FIG. 3(a) shows a double-sided copper plated sheet of LCP designated generally at 10. FIG. 3(b) shows 10 sheet after lithography where the copper has been etched to form copper pedestals 12 opposite each other on the two sides of the LCP. In FIG. 3(c) holes 14 have been drilled through the copper and LCP sheet, and copper wires 16 are inserted as shown in FIG. 3(d). The copper is soldered to the wire at the indicated points to provide a hermetic seal and prevent any moisture ingress into the package.

Figure 4:
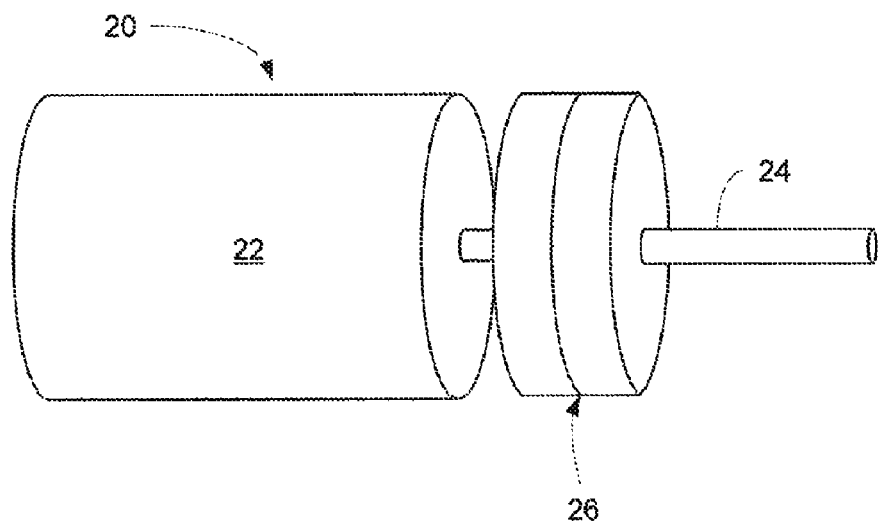
FIG. 4 is a diagrammatic perspective showing the design of an electrical pin for a single hermetic electrical port.

FIG. 4 shows another method of implementing a hermetic electrical port in an LCP package. Here, a copper lead body 20 is fashioned in such a manner that there is one portion that is preferably fabricated as a relatively larger cylindrical shape 22 that resides either inside or outside the package and a thinner lead 24 that protrudes through the wall of the LCP package. An LCP/Cu disk shaped washer 26 is made from a commercially available sheet such as Rogers Corporation's ULTRALAM® 3000. The copper on the disk is soldered to the copper lead and the LCP layer can be sealed to the LCP package either by applying proper heat and pressure or by ultrasonically welding via properly placed energy directors. In practice, the larger cylindrical shape 22 can be smaller, even matching the diameter of the thinner lead 24.

Figure 5:
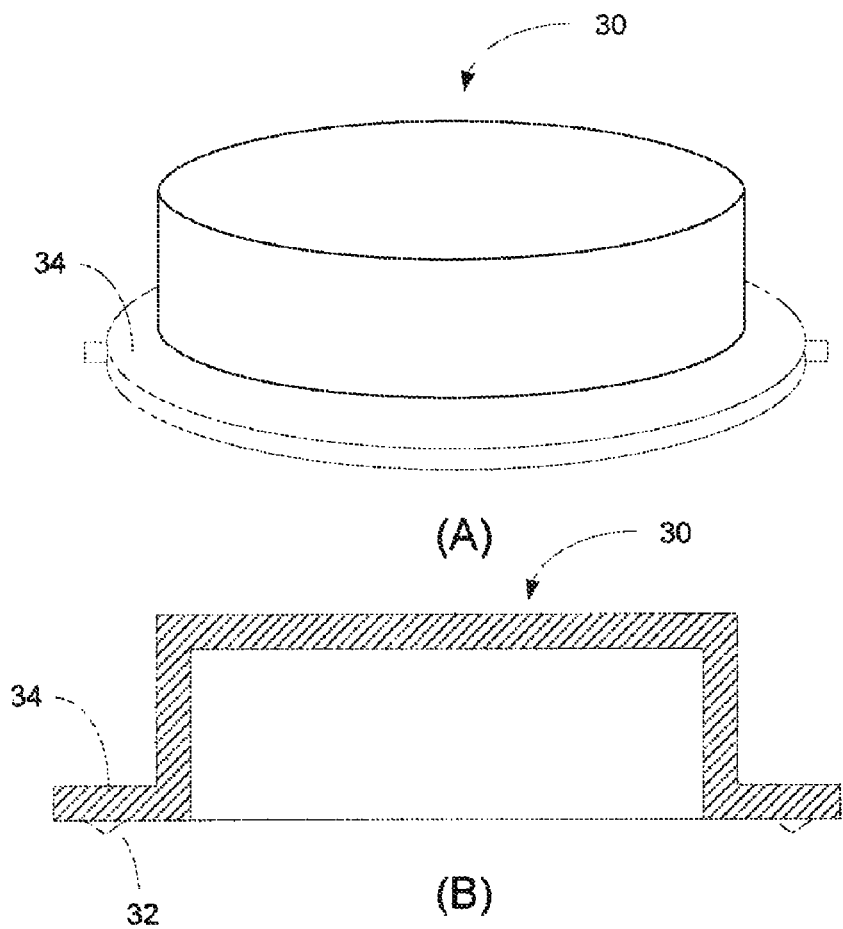
FIG. 5A is a diagrammatic perspective showing a lid for an LCP package.
FIG. 5B is a diagrammatic elevational cross-sectional view taken through the center of the lid shown in FIG. 5A.

The electrical ports shown in FIGS. 3 and 4 must be incorporated into the walls of a suitably fashioned lid or base of an LCP package. Such a package can be designed to consist of a lid and a base which are formed by molding the LCP, which is the preferred method, or by machining suitable blocks of LCP. Such an LCP package lid is shown in FIG. 5(a) where it is designated generally at 30. The shape of lid 30 is only for illustration purposes and can be changed to suit the application. FIG. 5(b) shows a cross-section of lid 30 including energy directors 32 located at the bottom of a rim 34. The function of energy directors 32 is discussed later. As can be appreciated, the lid has the general cross sectional shape of shallow-crowned flattop hat having a brim.

Figure 6:
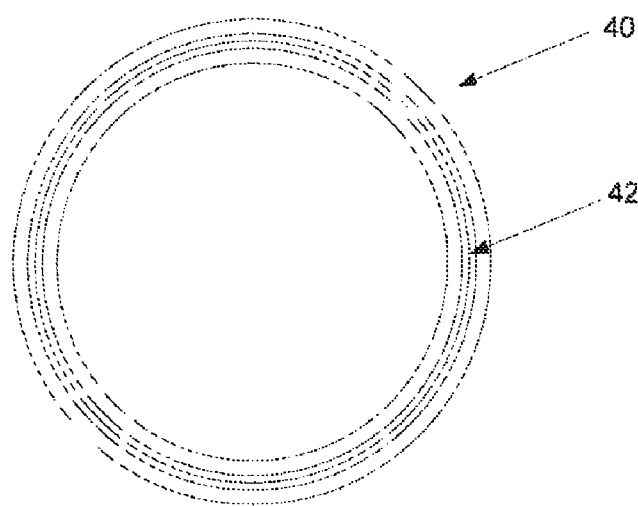
FIG. 6 is a diagrammatic plan view showing the base of an LCP package.
Figure 7:
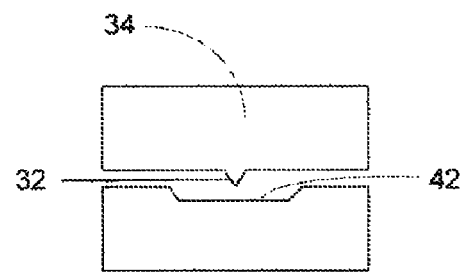
FIG. 7 is a diagrammatic elevational detail showing energy directors used in the process of performing ultrasonic welding operations in fabricating LCP packages of the invention.

FIG. 6 shows LCP package base designated generally at 40. Lid 30 and base 40 are joined by the well-known method of ultrasonic welding. Ultrasonic bonding is a technique widely used in the manufacture of plastic components. The materials to be welded must be thermoplastic. That is, they must not change their chemical composition upon melting. The process relies upon the use of high frequency sound waves to create localized heating by friction. The area of contact between the two surfaces to be joined is small because of specially designed energy directors as shown in FIG. 5(b) and in close-up in FIG. 7. In the bonding process, the two parts to be welded are held together under pressure and are then subjected to ultrasonic vibrations, usually at a frequency of 10 to 40 kHz. The ultrasonic waves produce local heat along this contact as the two parts rub against each other at high frequency. The heating softens the thermoplastic material and causes the two parts to be fused together. The ability to weld a component successfully is governed by the design of the equipment, the mechanical properties of the material to be welded and the design of the components. In order to ensure that heat is generated locally, at the joint between the two parts, the components are designed with small features, the energy directors 32 of FIG. 5(b). Energy directors 32 consist of small (typically 0.1") ridges with pointed tops, which serve to focus ultrasonic energy into a relatively small volume of material, causing rapid heating and subsequent melting. Other types of joints may also be used for ultrasonic bonding such as shear joint, scarf joint and butt joint.

Figure 8:
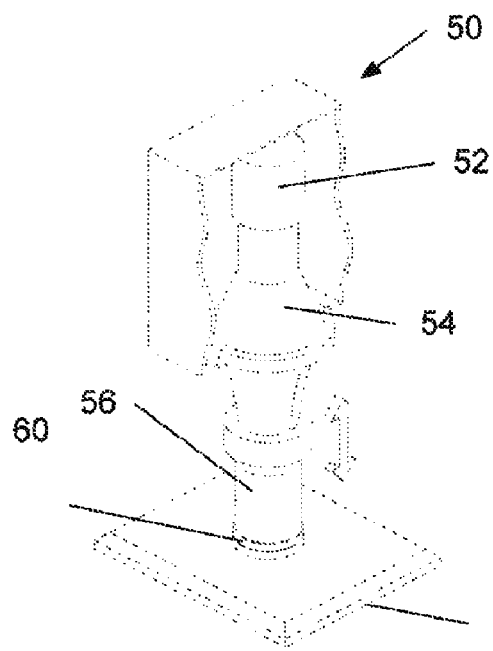
FIG. 8 is a diagrammatic perspective view of an ultrasonic welder useful in practicing the invention.

A typical ultrasonic bonding system 50 is illustrated in FIG. 8. It consists of a transducer 52, booster 54, horn 56 (or sonotrode) and anvil 58. The two parts to be welded are sandwiched between the horn 56 and the anvil 58, which must be relatively immoveable. Ultrasonic energy from the transducer 52 is amplified by the booster 54 and coupled to the horn 56, which in turn transmits it to the upper of the two components (Shown generally at 60). An energy director is provided in the LCP cap, and the ultrasonic welding horn 54 is configured to operate in conjunction with the shape of the LCP cap.

Ultrasonic technology is described for bonding only by way of example. Other welding techniques such as inductively heated welding and thermal welding may also be used.

Figure 9:
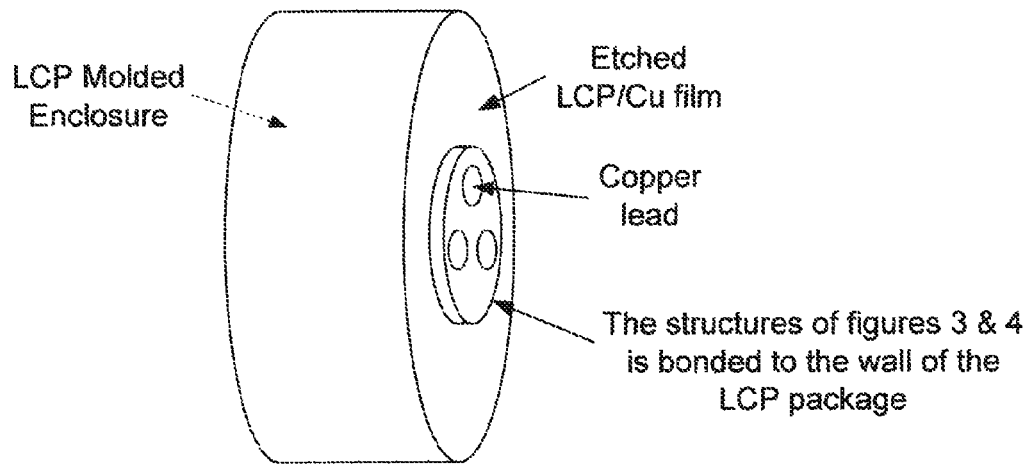
FIG. 9 is a diagrammatic perspective view showing an electrical port welded to an LCP cap of the invention.
Figure 10:
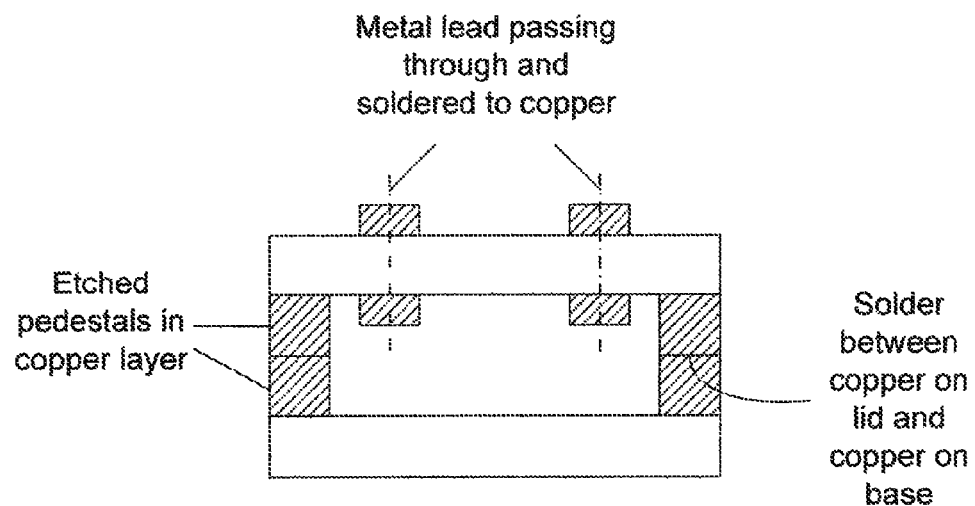
FIG. 10 is a diagrammatic elevational view, partially in section, showing an LCP package with a copper soldered seam.

In general, electrical ports as shown in FIGS. 3 and 4 are appropriately positioned on the lid or other appropriate wall of an LCP package and welded in place, as shown in FIGS. 9 and 10. This joint is inherently hermetic since it bonds LCP to LCP. Metal pedestals may also be formed in lid and base to provide for solder joints between base and lid as shown in FIG. 10.

The structures discussed above utilize copper clad LCP sheets sold commercially by companies such as 3M and Rogers Corporation primarily because these products have excellent adhesion between the copper and LCP. However, recently several researchers have reported techniques for achieving excellent adhesion between vacuum deposited metal films and LCP surfaces. For example, Yang, et al (patent application US 2002/0028293) describes methods for deposition of a thin film of metal on a suitably treated LCP surface to enhance adhesion. The LCP surface is first etched in a suitable solution consisting of potassium hydroxide and ethanolamine. The thin metal layer is applied either by electroless metal plating or vacuum deposition of metal. The thin metal layer is then used as a seed layer for conventional electroplating to generate thicker metal film if needed.

Figure 11:
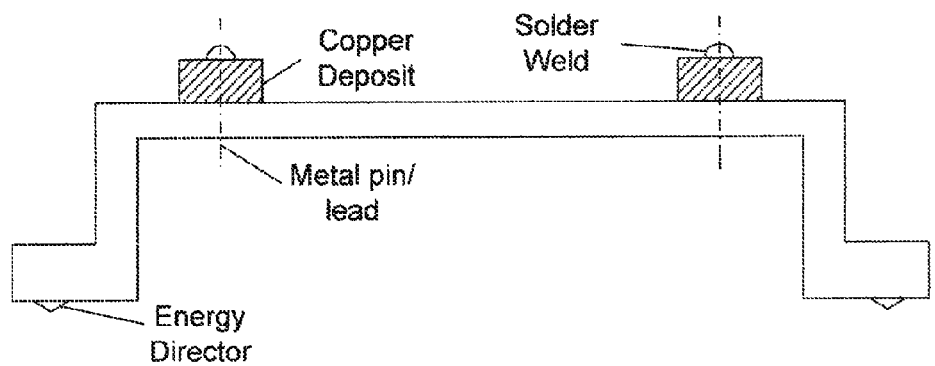
FIG. 11 is a diagrammatic elevational view, partially in section, showing electrical ports fabricated using deposited metal film on the wall of liquid crystal polymer package.

The ability to form metal films with good adhesion on LCP surfaces can also be used to enabling hermetic electrical ports in LCP packages such as shown in FIG. 11.

A method of forming hermetic electrical ports in copper clad LCP is shown in FIG. 3 and a method of incorporating these electrical ports into the walls of a suitable LCP lid or base is shown in FIGS. 9 and 10. However, in some cases the copper clad LCP with electrical port could itself be used in a hermetic package without the need for additional LCP structures, as shown in FIG. 12.

Figure 12:
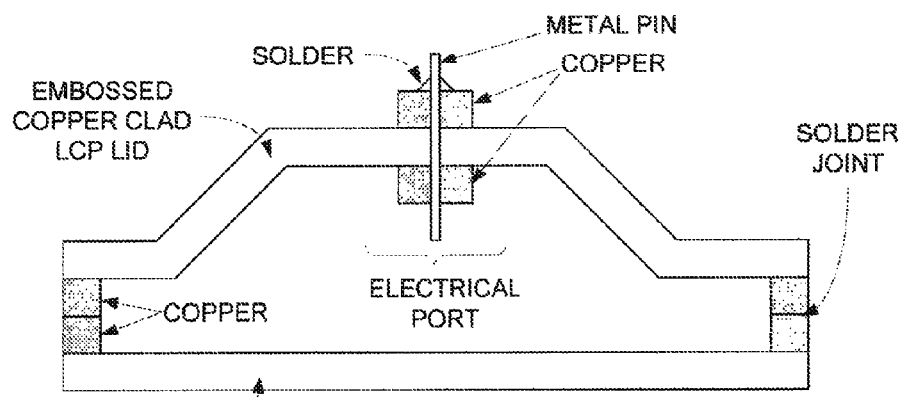
FIG. 12 is a diagrammatic elevational view, partially in section; showing an etched copper clad LCP lid and base combined to form a package having a hermetic electrical port.

Since the copper clad LCP is flexible (up to an LCP thickness to about 1 mm), it can be embossed into lid type shapes as shown in FIG. 12. The copper on one side can be etched into appropriate shapes either before or after embossing. Similarly, the base can also be copper clad LCP where the copper on one side is etched to mate with the copper remaining on the embossed lid. The two parts are then joined by soldering the mating copper along the perimeter of the package using suitable solders. Since soldered metal forms a hermetic joint, the whole structure is rendered hermetic. Clearly the base could also be embossed if required for design reasons.

Figure 13:
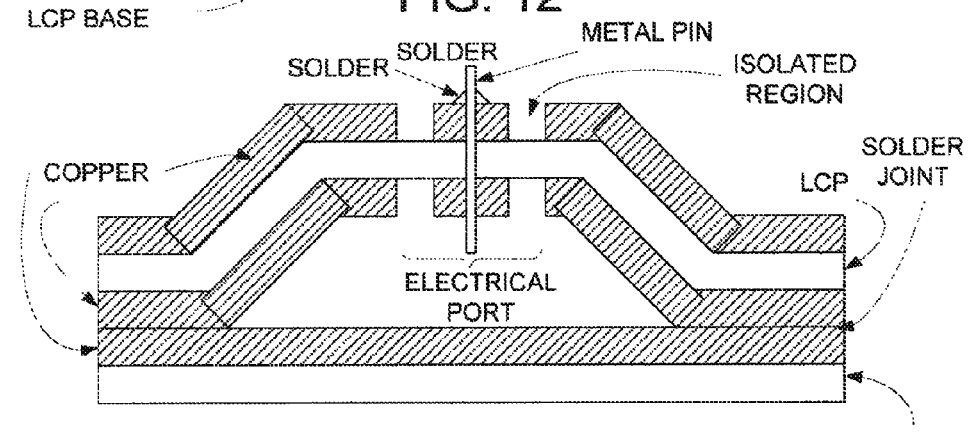
FIG. 13 is a diagrammatic elevational view, partially in section, showing the use of selectively etched copper clad LCP bases and lids to form packages having hermetic electrical ports.

The foregoing structure can also be modified as shown in FIG. 13 so that most of the inner and outer surface is either double or single clad in copper. The electrical ports are electrically isolated by etching the copper in a small region surrounding the metal pin. In this method, moisture ingress is further reduced since the area that has only an LCP barrier between the outside and inside of the package is dramatically reduced compared to FIG. 12. Furthermore, the copper that almost completely surrounds the devices inside provides electromagnetic shielding which may be extremely useful in many applications.

Often microelectronic and optoelectronic packages need to incorporate metal heat sinks. Examples of packaged devices that need heat sinks are power transistors, laser diodes, thermoelectric coolers, and high bandwidth receivers. In other instances, packaged devices may need to be mounted on ceramic substrates for reasons of design and performance. For example, suitable choice of ceramic may be a way to control the dielectric constant or loss tangent of the substrate material. However, it may be necessary for one surface of the ceramic substrate to be accessible from outside the package.

In both these, and other instances, a metal heat sink or a ceramic substrate could potentially constitute the base of a package with an LCP structure constituting the lid of the package. The combination of metal or ceramic base and LCP lid can enable a hermetic package with a technique to form a hermetic seal between the LCP lid and the metal or ceramic base.

Figure 14:
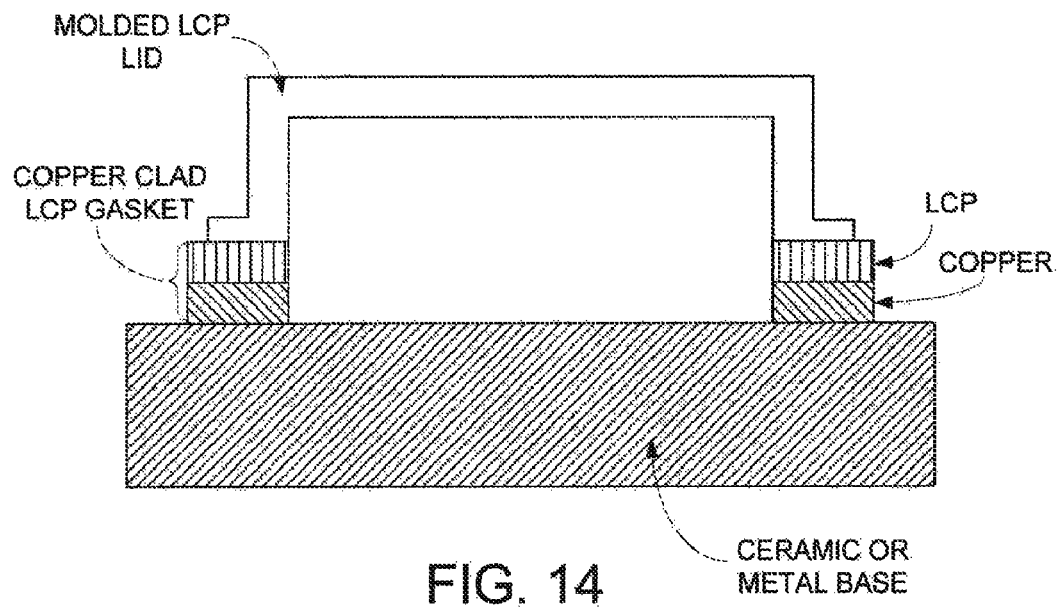
FIG. 14 is a diagrammatic elevational view, partially in section, showing the use of a partially etched LCP lid attached to a ceramic or metal base via metal pedestals to form a hermetic package that can incorporate heat sinks and or electrical ports.

FIG. 14 shows a method of implementing a hermetic seal between an LCP lid and a metal or ceramic base using copper clad LCP. Here, copper clad LCP is cut in the shape of a suitable gasket to mate with the perimeter of the LCP lid. The copper side of the gasket is soldered to the base using an appropriately chosen solder. The lid is then sealed to the LCP side of the gasket using techniques discussed earlier, such as ultrasonic welding, thermal welding or laser welding. Conversely, the gasket may first be attached to the lid and then soldered to the base. The sequence will depend on considerations such as the nature of the components being housed in the package.

Having described the methods and structure for forming hermetically sealed packaging using metal clad LCP with hermetic electrical ports, experimental data to demonstrate the moisture imperviousness of such LCP packages will now be discussed.

EXAMPLE 1

Figure 15:
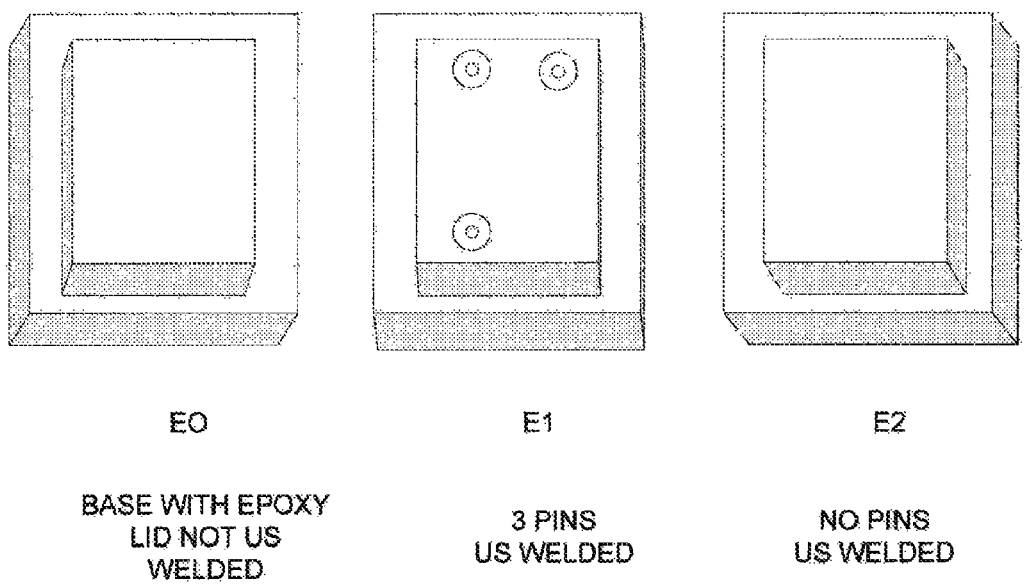
FIG. 15 is a diagrammatic elevational view showing the exterior structure of ultrasonically bonded LCP lids and bases forming samples used in testing the invention for moisture resistance.

In this example, Ticona Vectra A950 LCP resin was molded into suitable base and lid structures, including energy directors for ultrasonic welding. The perimeter of the base and lid was approximately 1" square and height of the combined base and lid was approximately 0.5". Several bases were filled with two-component ACE brand epoxy and the epoxy was allowed to set. Subsequently, the epoxy filled bases and LCP lids were ultrasonically bonded using standard techniques as shown in the photograph of FIG. 15. Small sections of ULTRALAM3850 double copper clad LCP, acquired from Rogers Corporation, was cut into 1" squares, the copper was etched from one side, and the LCP side was thermally bonded to the LCP lid. A copper pin was inserted into the package through a small hole drilled in the copper pads and the pin was soldered to the copper pad.

In FIG. 15, the sample marked EO has an epoxy filled base, but the lid is not ultrasonically bonded to the base, but instead sits on it loosely. The sample marked E2 has an epoxy filled base, the lid is ultrasonically bonded to the base, but the structure has no electrical ports incorporated. Sample marked E1 has an epoxy filled base, the lid is ultrasonically bonded to the base, and it incorporates three electrical ports with copper etched away to isolate the pins electrically form each other.

Figure 16:
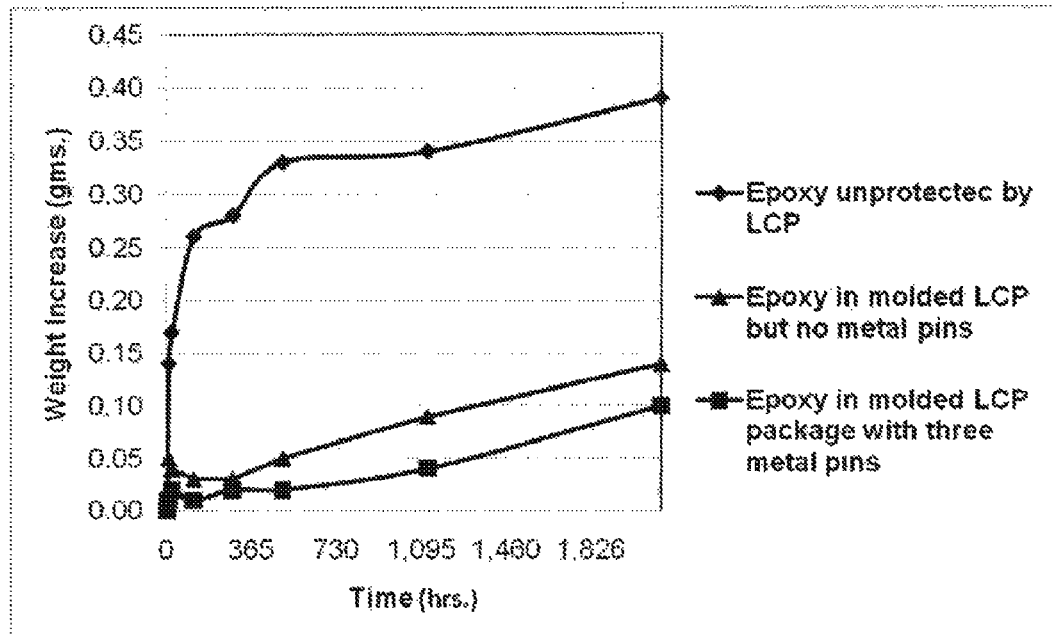
FIG. 16 is a graph illustrating the weight increase of molded LCP packaged samples shown in FIG. 15 after exposure to 100% relative humidity at 90° C.

All samples were placed in a 900 C oven in a 100% relative humidity environment. The samples were removed periodically and weighed. Typically, commercial epoxy absorbs 1 to 10% of its own weight in moisture when exposed to such an environment. This test would determine if the weight of sample EO where the epoxy is unprotected since the lid is not ultrasonically welded, would pick up moisture much faster than the other samples which are ultrasonically bonded. Comparison of sample EO to E2 would show if moisture absorption by epoxy protected in an ultrasonically bonded LCP package is significantly impeded compared to unprotected epoxy. Comparison of samples E2 to samples E1 would show if incorporation of electrical ports by the methods disclosed earlier compromises the moisture barrier properties of the packages. It is clear from FIG. 16 that EO picks up moisture much faster than the other samples while there is no difference between sample E2 and samples with pins to within the measurement error of the experiment. After 1000 hours the LCP protected samples had picked up 20% of the moisture that the unprotected sample picked up in about 100 hours. The weight of epoxy in all three packages was about 1.8 gm and the increase in weight of samples E1 and E2 was 0.12 gm on average after 2000 hr in a 90° C. chamber at 100% relative humidity. The surface area of all three packages was about 22 $cm^2$ and the thickness of LCP was 0.5 mm. The increase in weight of 0.12 gm is equal to the weight of moisture diffusing from the outside to the inside of the package. Using these numbers we calculate that the moisture transmission rate through a LCP package with electrical ports incorporated is about 13 $gm.mil/m^2.day.barr$ at 90° C. Therefore, using thermal activation energies measured separately, it is likely that the moisture transmission rate of the tested packages at 25° C. would be about 0.007 $gm.mil/m^2.day.barr$

EXAMPLE 2

In this example, ULTRALAM3850 pieces, approximately 3" square, were cut out of larger sheets. A disk shaped puck of epoxy was placed between two of the cut out pieces. One of the ULTRALAM pieces had one electrical port incorporated in it based on the design shown in FIG. 12. The two pieces of ULTRALAM were then soldered along the perimeter using Sn60/Pb40 solder so that the epoxy puck was completely surrounded with ULTRALAM3850. All samples were placed in a 900 C oven in a 100% relative humidity environment. The samples were removed periodically and weighed. In addition, one puck of epoxy was placed in the test chamber unpackaged in ULTRALAM so that it was directly exposed to the humid environment. This test would determine if the weight of the unprotected epoxy puck would increase much faster than the other samples.

Figure 17:
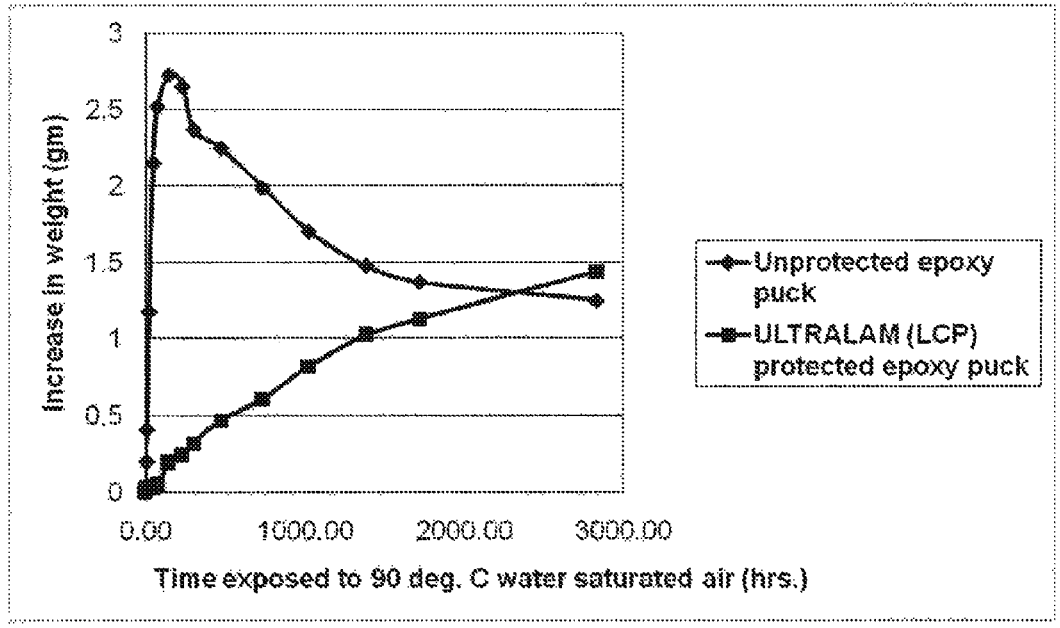
FIG. 17 is a graph illustrating the weight increase of epoxy packaged in copper clad LCP using the method shown in FIG. 12 after exposure to 100% relative humidity at 90° C.

FIG. 17 shows the results over 2550 hours. The weight of the unprotected epoxy puck increases fast and then starts to decrease. This decrease is because the epoxy chemically decomposes in the hot, humid environment as was seen by its texture and that it progressively became soft and spongy with the passage of time. The weight of the LCP protected epoxy puck increased much more slowly and after 2550 hours had picked up only about half the moisture that the unprotected epoxy puck picked up in 140 hours.

While fundamental and novel features of the invention have been shown and described with respect to preferred embodiments, it will be understood that those skilled in the art may make various changes to the described embodiments based on the teachings of the invention and such changes are intended to be within the scope of the invention as claimed.

What is claimed is:

1. A packaging system for hermetically sealing optoelectronic components; said packaging system comprising:

a housing for providing a hermetically sealed interior space for receiving and supporting optoelectronic components, said housing having at least one section of wall having at least one layer comprising a liquid crystal polymer (LCP); and at least one hermetically sealed electrical port formed in said at least one section of wall over a predetermined area thereof, said hermetically sealed electrical port comprising a layer of metal adhered to said LCP layer and overlying said predetermined area on said at least one section of wall, an electrode passing through said metal from the exterior of said system to said interior space to provide an electrical communication path between the optoelectronic components and the exterior of said packaging system; and a solder joint formed between said electrode and said layer of metal to provide a hermetic connection between said layer of metal and said electrode to assure that said packaging system remains hermetically sealed with said port present.

2. The packaging system of claim 1 wherein said housing comprises a base and a lid each of which have complementary configured mating sections for forming a hermetic seal between said base and lid.

3. The packaging system of claim 2 wherein said lid comprises a layer of LCP having the general cross sectional shape of shallow-crowned flattop hat having a brim.

4. The packaging system of claim 2 wherein said complementary configured mating sections are both made of LCP.

5. The packaging system of claim 2 wherein said complementary configured mating sections are both made of copper to facilitate soldering them to form a hermetic joint.

6. The packaging system of claim 2 wherein said base is selected from the group comprising metals and ceramics for purposes of heat removal.

7. The packaging system of claim 6 further including a heat sink operatively associated with said base.

8. The packaging system of claim 1 wherein said system impedes moisture ingress such that the diffusion rate of moisture from the outside to the inside of said packaging system is about 13 $gm.mil/m^2 \cdot day \cdot barr$ or lower at 90° C.

9. An electrode assembly for forming a hermetic port in an LCP package, said assembly comprising:
    an LCP washer having a layer of metal adhered to said LCP layer;
    an electrode passing through both said LCP washer and said layer of metal adhered thereto; and
    a solder joint between said layer of metal and said electrode to form a hermetic seal between the two so that said LCP washer can be adhered to the surface of an LCP package with said electrode passing therethrough to form an electric port.

* * * * *